Feb. 15, 1966 J. C. WHEELER 3,234,629

METHOD FOR PRODUCING PRINTED CIRCUITS

Filed June 14, 1962

INVENTOR.
JAMES C. WHEELER
BY
Morse + Altman
ATTORNEYS

United States Patent Office 3,234,629

Patented Feb. 15, 1966

3,234,629

METHOD FOR PRODUCING PRINTED CIRCUITS

James C. Wheeler, Topsfield, Mass., assignor to Defiance Printed Circuit Corp., Malden, Mass., a corporation of Massachusetts Filed June 14, 1962, Ser. No. 202,417
4 Claims. (Cl. 29—155.5)

Figures 1, 2, 3, 4, 5, 6:
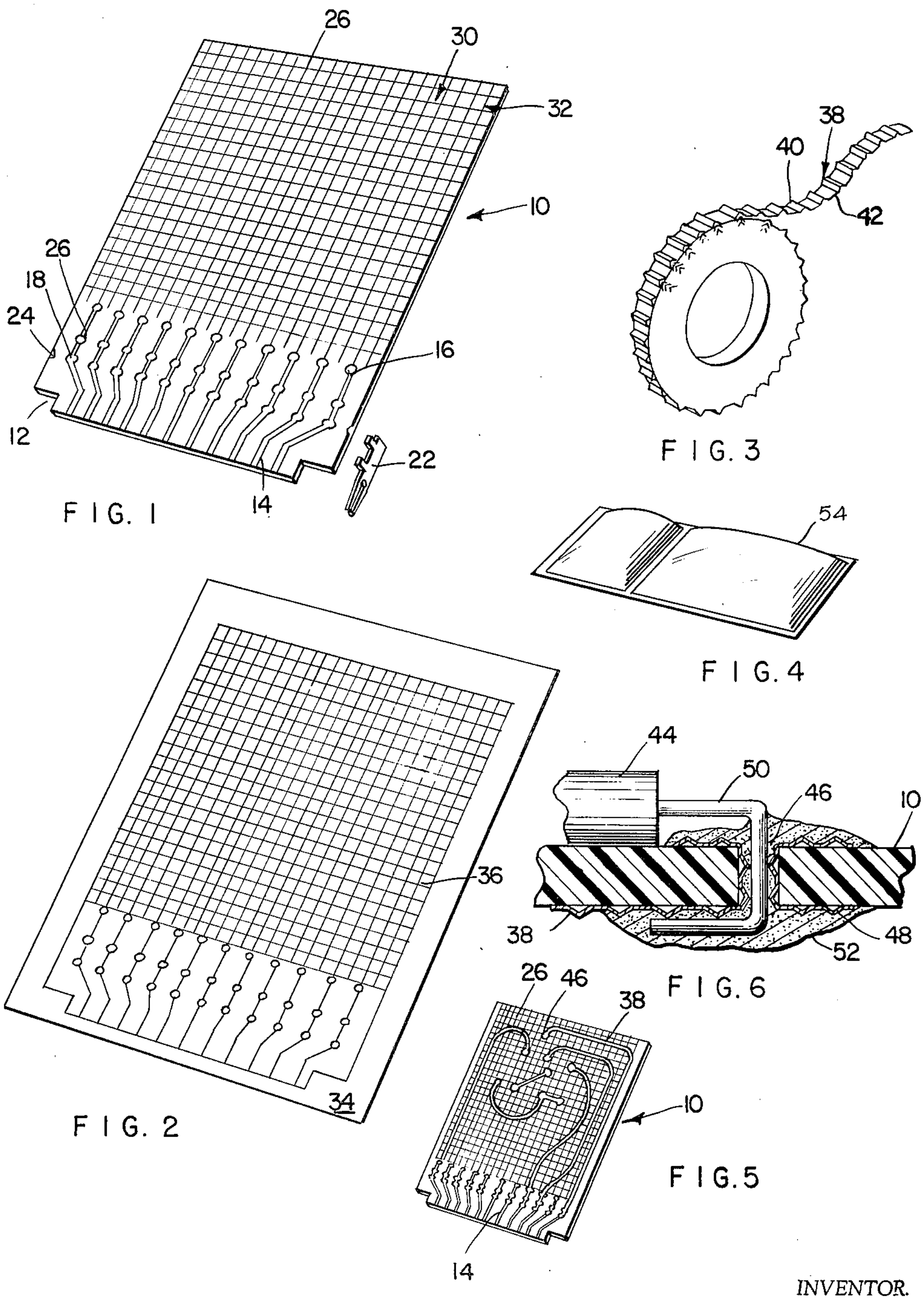

This invention relates generally to printed circuits and more particularly concerns a novel method and associated apparatus for producing printed circuits and especially prototype circuits mounted on insulating boards. This invention also includes a novel method for mounting components to a printed circuit board.

In the last decade, printed circuits have won wide acceptance in the electronic industry and have been recognized as being particularly useful in providing a quality, low cost and dependable circuit system which readily lends itself to mass production techniques. The printed circuit is usually in the form of conductive strips laid out in the desired circuit configuration and formed on a stiff non-conductive panel by a photographic etching process or the like. The resulting circuit and board is not only self-supporting but is also employed to support the various components such as resistors, capacitors and transistors, for example, which form part of the particular circuit.

Heretofore, the benefits of printed circuit boards have inured primarily to mass production units because of the cost involved in preparing the original dies, negatives and so forth employed in the production of the boards. As a result, the advantages of printed circuits have not been generally available for use by experimenters, hobbyists, design engineers or others involved in limited production situations.

Accordingly, it is an object of the present invention to provide a novel method and associated apparatus for designing and conveniently fabricating printed circuits on an individual basis.

Another object of this invention is to provide novel components which may be applied in a cooperative manner to facilitate prototyping of printed circuit designs.

Still another object of this invention is to provide an improved method for mounting components to a printed circuit board.

More particularly, this invention features a method of producing a printed circuit board comprising the steps of first plotting a circuit diagram graphically on a facsimile of a circuit board having a non-conductive grid pattern appearing across the flat surface thereof, secondly reproducing the circuit diagram on the board by bonding to the board surface adhesive backed strips of flexible, corrugated and conductive material and thirdly, coating the circuit and board with a film of dielectric potting material. This invention also features a method of mounting components to a circuit board whereby component leads are inserted through a hole formed in the board and crimped between the free ends of conductive strips lodged within the holes and secured by a bead of solder. The invention also features a circuit board provided with a non-conductive grid pattern for locating precisely points for drilling or punching terminal holes.

But these and other features of the invention, along with further objects and advantages thereof, will become more readily apparent from the following detailed description of a preferred embodiment of the invention, with reference being made to the accompanying drawings, in which;

FIG. 1 is a view in perspective of a circuit board blank made according to the invention, FIG. 2 is a view in perspective of a work sheet for use in plotting a circuit diagram, FIG. 3 is a perspective view of a spool of conductive strip material for bonding to the board of FIG. 1, FIG. 4 is a perspective view of a tube of potting material for coating the FIG. 3 board, FIG. 5 is a perspective view of an assembled printed circuit board, and, FIG. 6 is a detail sectional view in side elevation showing a novel connection for mounting components to the board.

Referring now to the drawings, there is illustrated in FIGS. 1–4 a group of components which are employed in the practice of the invention and which may be conveniently provided in kit form for use by circuit designers, hobbyists and the like. As shown, the kit includes a circuit board blank, indicated generally by the reference character 10, and fabricated from a laterally stable panel of dielectric material such as a phenolic laminate or the like.

The panel may be provided in any convenient size or shape although typically it has a generally rectangular configuration and may have a pair of notched corners 12 at the plug-in end. It will be observed that a series of abbreviated terminal strips 14 are distributed in evenly spaced relation along the margin of the plug-in end and may be formed by a photographic, plating, stamping or similar process. These strips are of electrically conductive material bonded securely to the panel surface and characterized by annular enlargements 16 at their inner ends and a pair of annular portions 18 and 20 located along the strips. The annular portions 18 and 20, when drilled through their centers, accommodate pronged connectors such as those indicated by reference character 22. Normally, when connectors of this type are used, the marginal portion of the plug-in end of the panel is cut off and discarded. Guide marks 24 are provided on either edge to indicate the preferred cutting line.

Over the remaining surface of the panel there appears a grid pattern 26 defining spaces 28 arranged in vertical columns 30 and horizontal rows 32, typically .0002″ on centers. The grid pattern is non-conductive and may be applied by a stenciling process or any other convenient printing tetchnique.

In FIG. 2 there is illustrated a paper work sheet 34 bearing an exact facsimile 36 of the circuit board 10 of FIG. 1. In practice, a circuit will first be plotted on the facsimile so that the designer will know beforehand precisely how the completed circuit will appear. By providing the grid pattern described, the designer may pinpoint both on his worksheet 34 and on the board 10 the location of whatever holes may be needed to be drilled for receiving the terminal leads of any components which are to be mounted.

Once the holes have been formed in their proper locations by drilling, punching or the like, the circuit, which has been pre-plotted on the worksheet 34, is reproduced on the board 10 using conductive strip material 38 illustrated in FIG. 3. The strip material 38 is normally supplied in spool form and is characterized by transverse corrugations 40 spaced at $\frac{1}{10}$″ intervals. Typically, the strip material is fabricated from copper .004 to .005″ thick and $\frac{1}{32}$ to $\frac{1}{4}$″ wide with an adhesive backing provided on its inner surface 42. This adhesive backing may be either a thermosetting material such as a dry film resin or may be a pressure sensitive stratum covered by a removable protective ply (not shown).

With the thermosetting type of adhesive backing, the strip 38 is bonded to the surface of the board 10 by applying sufficient heat to the strip for the resin to unite intimately with the board surface. In practice, the tip of a soldering iron, heated to about 600–700° F. may be used to set the resin by advancing the tip slowly along the top surface of the strip. Alternatively, the strip may be bonded by pressing the tip of the strip between corrugations and holding it in position for 1 to 3 seconds, then pressing again between the next adjacent pair of corrugations. When using pressure sensitive adhesive strips, the removable protective ply is pulled off the strip in advance of its being pressed onto the board surface.

The conductive strip 38, by reason of the corrugations 40, displays extreme transverse as well as lateral flexibility. A strip 1/16" wide for example, provides a minimum bend radius of 1/4". This feature permits the laying out of very intricate circuit configurations, as suggested in FIG. 6, having sharp turns and bends which would not be possible to fabricate with conventional flat strips.

In addition, the strips may easily be folded laterally so as to insure a good contact over irregular surfaces and around corners. In this regard, reference is made to FIG. 6 where there is shown a novel connecting arrangement for mounting a component 44, such as a resistor or condenser, for example, to the board 10. The connection involves first forming a hole 46 through the board 10 at a point that is first plotted on the work sheet 34 and then located on the grid pattern 26 on the board. This is easily done by use of the columns 30 and rows 32 which make up the grid pattern. Once the hole 16 is made, by drilling or the like, the free end of the conductive corrugated strip 38 is passed through and bonded against the back surface of the board. If desired, another shorter, section 48 of conductive strip is likewise passed into the opening and bonded to both sides of the board as shown. Next, the leg or terminal lead 50 is inserted in the opening 46 and the end crimped back upon the strip 38 or the strip 46. Finally, the connection is completed by filling the hole 46 and surrounding area with a solid mass of solder 52.

The resulting connection is extremely strong and tight, providing good electrical contact and avoiding the need for eyelets normally empoyed for mounting components to a circuit board.

Once the circuit is completed the various conductive strips as well as the board itself may be coated with a film of a suitable potting material such as two-part epoxy resin cement, for example. For convenience, the cement may be packaged in a double compartment plastic bag 54 such as that shown in FIG. 4. The two compartments may contain a base resin and an accelerator in a separated condition until ready for use. Prior to opening the bag, th seal between the compartments may be ruptured and the two materials blended by massaging the bag.

The invention described herein is extremely useful for circuit designers in that they may easily and conveniently fabricate a workable printed circuit with a minimum amount of effort and equipment. This is particularly desirable for developing prototype circuits as well as for special, limited use circuits. In kit form, the invention provides the individual hobbyist with all of the materials needed to complete a completely dependable printed circuit and one which is comparable in every respect to printed circuits manufactured by any other known process.

While the invention has been described with particular reference to the illustrated embodiment, it will be understood that various modifications thereto will appear to those skilled in the art. Accordingly, the above description and accompanying drawings should be taken as illustrative of the invention rather than in a limiting sense.

Having thus described my invention, what I claim and desire to obtain by Letters Patent of the United States is:

1. A method of producing a printed circuit, comprising the sequential steps of plotting a circuit diagrammatically on a facsimile of a circuit board having a non-conductive grid pattern appearing across the flat surface thereof, reproducing the circuit diagram on the circuit board with adhesive backed corrugated flexible strips of conductive material, bonding said strips to said board and finally coating said circuit and said board with a film of dielectric potting material.

2. A method of producing a printed circuit comprising the sequential steps of plotting a circuit diagrammatically on a facsimile of a circuit board having a non-conductive grid pattern appearing across the flat surface thereof, reproducing the circuit diagram on the circuit board with corrugated flexible strips of conductive material having a coating of thermosetting material on one side thereof, temporarily heating said strips to bond them to said board and finally coating said circuit and said board with a film of dielectric potting material.

3. A method of producing a printed circuit system, comprising the sequential steps of plotting a circuit on a facsimile of a circuit board having a non-conductive grid pattern appearing across the flat surface thereof, drilling holes through said board at preselected locations to accommodate leads for circuit components, reproducing the circuit diagram exactly on the circuit board with adhesive backed corrugated strips of conductive material, passing the free ends of said strips through said holes and folding said ends against the opposite surface of said board, bonding said strips in place, inserting component leads through appropriate holes and crimping them back upon said strips, filling said holes and building up around the immediately surrounding area with solder to secure said leads firmly in position and finally coating said circuit and said board with a dielectric potting material.

4. A method of producing a printed circuit system, comprising the sequential steps of plotting a circuit on a fascimile of a circuit board having a non-conductive grid pattern appearing across the flat surface thereof, drilling holes through said board at preselected locations to accommodate leads for circuit components, reproducing the circuit diagram exactly on the circuit board with adhesive backed corrugated strips of conductive material, passing the free ends of said strips through said holes and folding said ends against the opposite surface of said board, bonding said strips in place, inserting component leads through appropriate holes and crimping them back upon said strips and finally filling said holes and building up around the immediately surrounding area with solder to secure said leads firmly in position.

References Cited by the Examiner

UNITED STATES PATENTS

| | | | |
|---|---|---|---|
| 1,939,130 | 12/1933 | Mills. | |
| 2,694,249 | 11/1954 | Kapp | 29—155.5 |
| 2,743,629 | 5/1956 | Pellegrino et al. | 29—155.5 X |
| 2,753,619 | 7/1957 | Franklin | 29—155.5 |
| 2,777,193 | 1/1957 | Albright et al. | 29—155.5 |
| 2,986,804 | 6/1961 | Greenman et al. | 29—155.5 |
| 3,011,247 | 12/1961 | Hanlet | 29—155.5 |
| 3,019,283 | 1/1962 | Little | 174—68.5 |
| 3,077,511 | 2/1963 | Bohrer et al. | 174—68.5 |

JOHN F. CAMPBELL, *Primary Examiner.*

JOHN P. WILDMAN, *Examiner.*